(12) United States Patent
Berthelon et al.

(10) Patent No.: US 10,777,680 B2
(45) Date of Patent: Sep. 15, 2020

(54) INTEGRATED CIRCUIT CHIP WITH STRAINED NMOS AND PMOS TRANSISTORS

(71) Applicants: STMicroelectronics (Crolles 2) SAS, Crolles (FR); Commissariat A L'Energie Atomique et aux Energies Alternatives, Paris (FR)

(72) Inventors: Remy Berthelon, Saint Martin Heres (FR); Francois Andrieu, Saint Ismier (FR)

(73) Assignees: STMicroelectronics (Crolles 2) SAS, Crolles (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/534,557

(22) Filed: Aug. 7, 2019

(65) Prior Publication Data
US 2019/0363190 A1 Nov. 28, 2019

Related U.S. Application Data

(62) Division of application No. 15/976,452, filed on May 10, 2018, now Pat. No. 10,418,486.

(30) Foreign Application Priority Data

May 12, 2017 (FR) ...................... 17 54199

(51) Int. Cl.
*H01L 29/78* (2006.01)
*H01L 21/8238* (2006.01)
(Continued)

(52) U.S. Cl.
CPC .... *H01L 29/7847* (2013.01); *H01L 21/76283* (2013.01); *H01L 21/823807* (2013.01); *H01L 21/84* (2013.01); *H01L 27/0207* (2013.01); *H01L 27/092* (2013.01); *H01L 27/1203* (2013.01); *H01L 29/786* (2013.01); *H01L 29/7849* (2013.01)

(58) Field of Classification Search
CPC ............... H01L 27/0207; H01L 27/092; H01L 27/1203
See application file for complete search history.

(56) References Cited

U.S. PATENT DOCUMENTS 7,700,416 B1 4/2010 Clifton et al.
9,252,208 B1 2/2016 Morin et al.
(Continued)

OTHER PUBLICATIONS

INPI Search Report and Written Opinion for FR 1754199 dated Jan. 4, 2018 (9 pages).

*Primary Examiner* — Matthew L Reames
(74) *Attorney, Agent, or Firm* — Crowe & Dunlevy

(57) ABSTRACT

Longitudinal trenches extend between and on either side of first and second side-by-side strip areas. Transverse trenches extend from one edge to another edge of the first strip area to define tensilely strained semiconductor slabs in the first strip area, with the second strip area including portions that are compressively strained in the longitudinal direction and/or tensilely strained in the transverse direction. In the first strip area, N-channel MOS transistors are located inside and on top of the semiconductor slabs. In the second strip area, P-channel MOS transistors are located inside and on top of the portions.

17 Claims, 13 Drawing Sheets

(51) Int. Cl.
*H01L 21/84* (2006.01)
*H01L 27/12* (2006.01)
*H01L 21/762* (2006.01)
*H01L 27/02* (2006.01)
*H01L 29/786* (2006.01)
*H01L 27/092* (2006.01)

(56) References Cited

U.S. PATENT DOCUMENTS

2007/0262392 A1    11/2007   Sudo
2011/0092047 A1    4/2011   Gaines et al.
2011/0175164 A1    7/2011   Bedell et al.
2016/0088680 A1    3/2016   Nguyen et al.

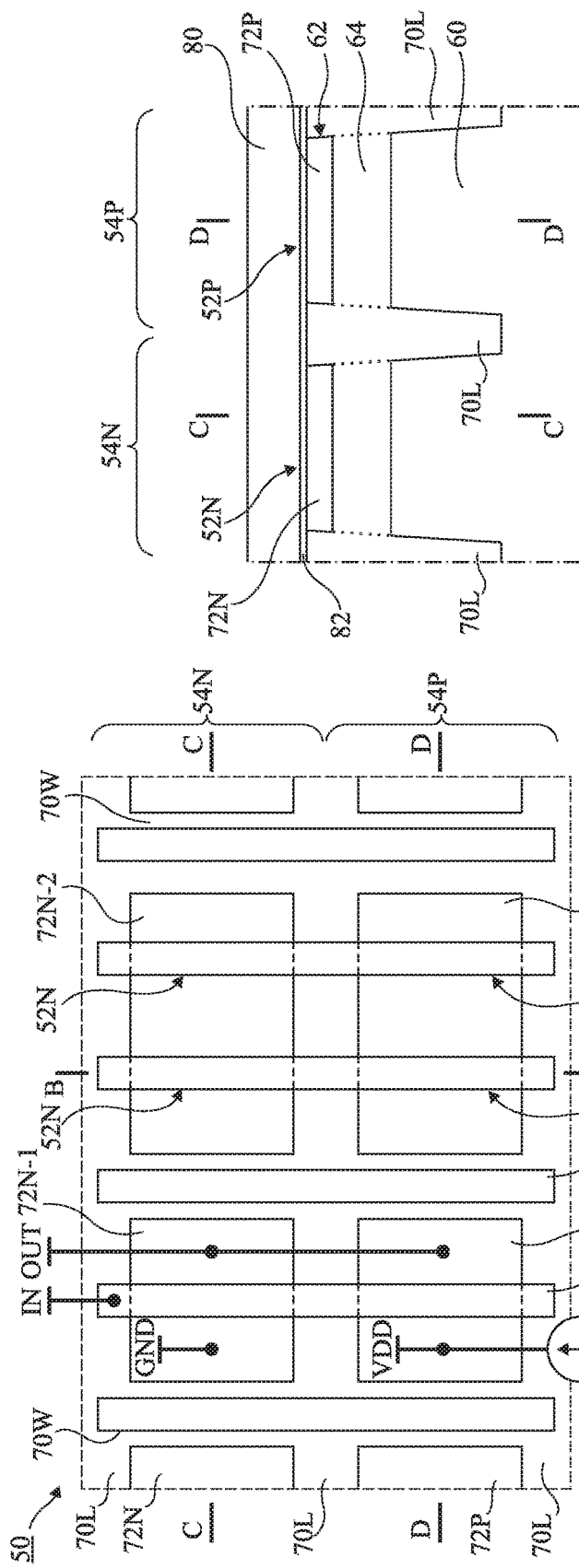
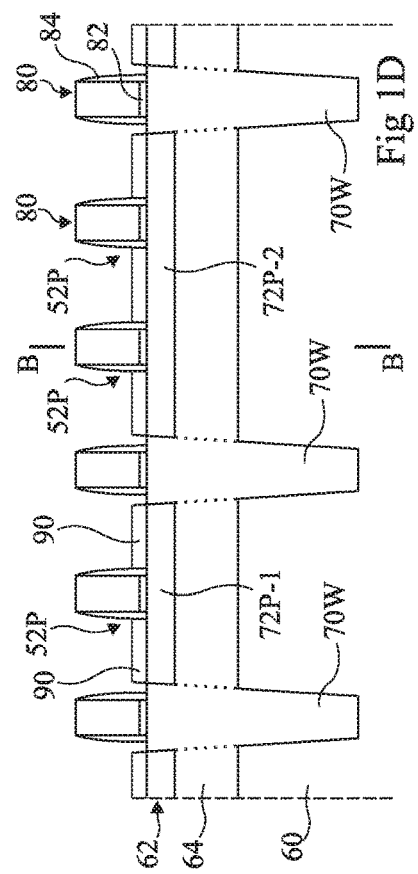
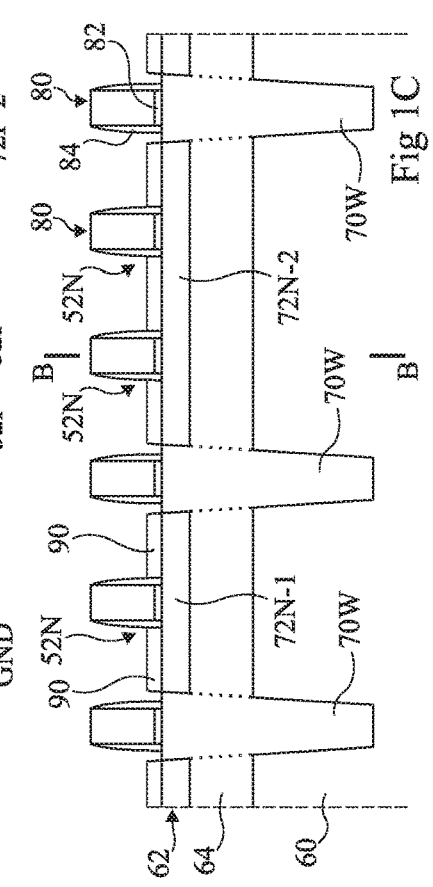

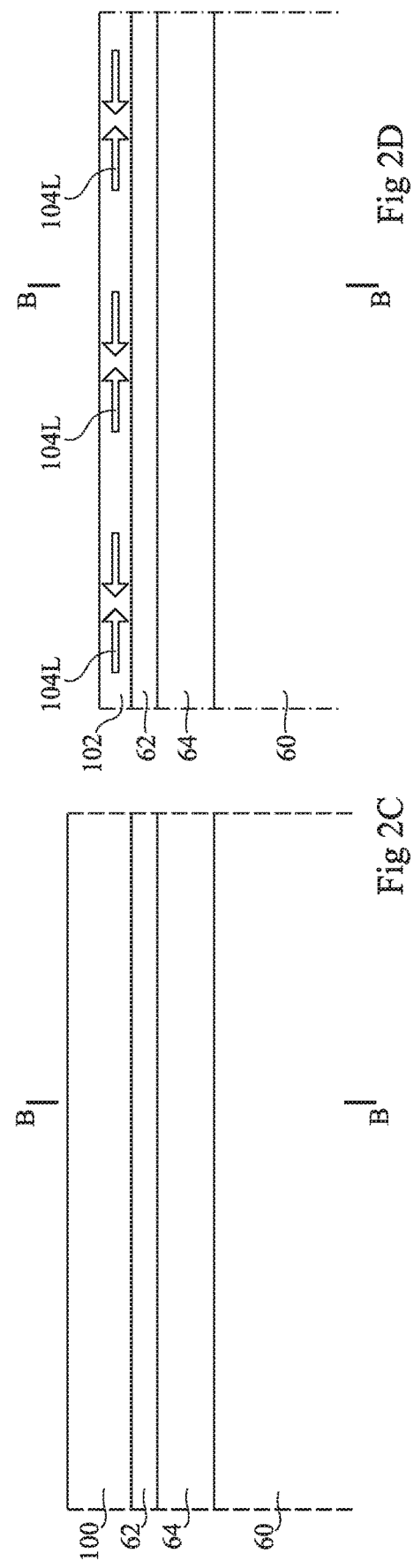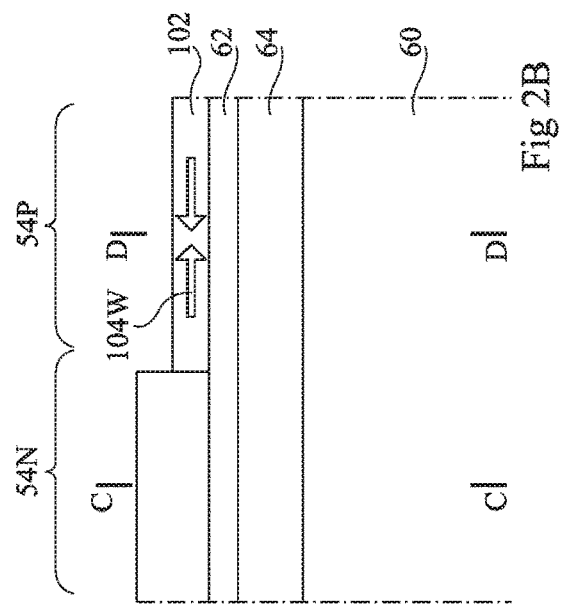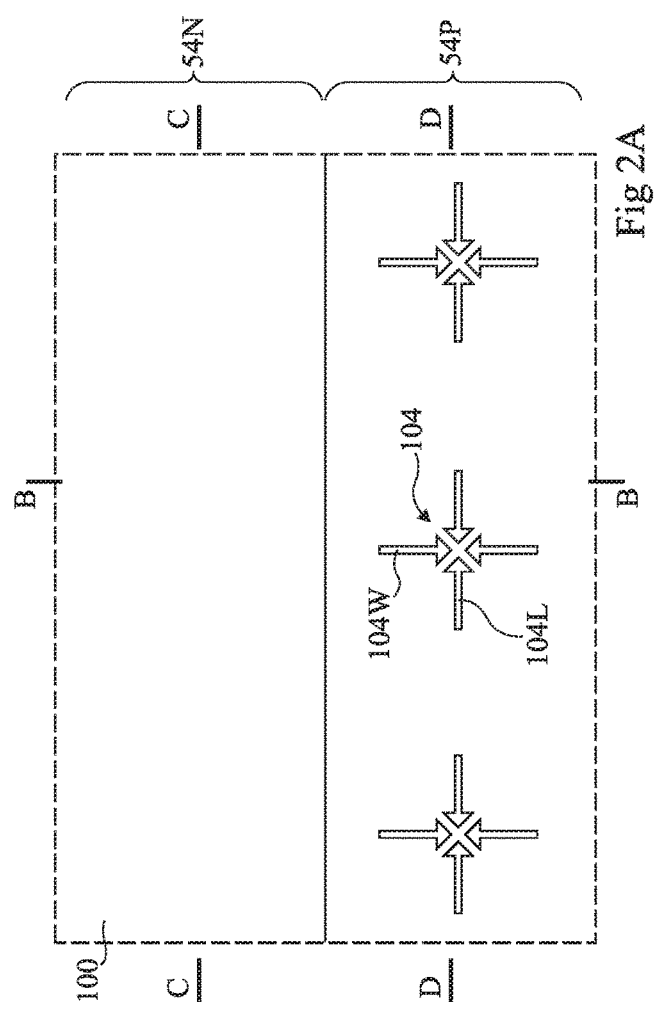

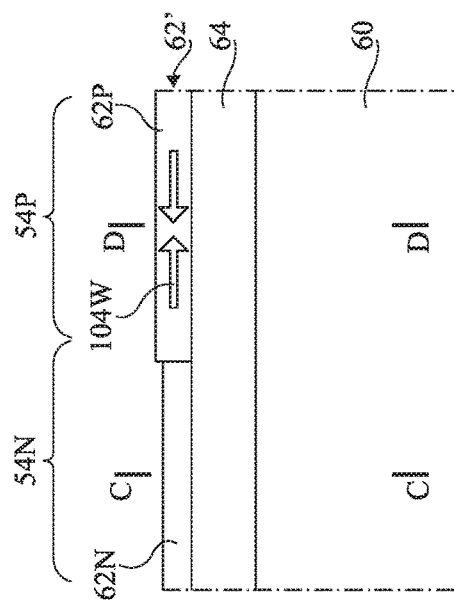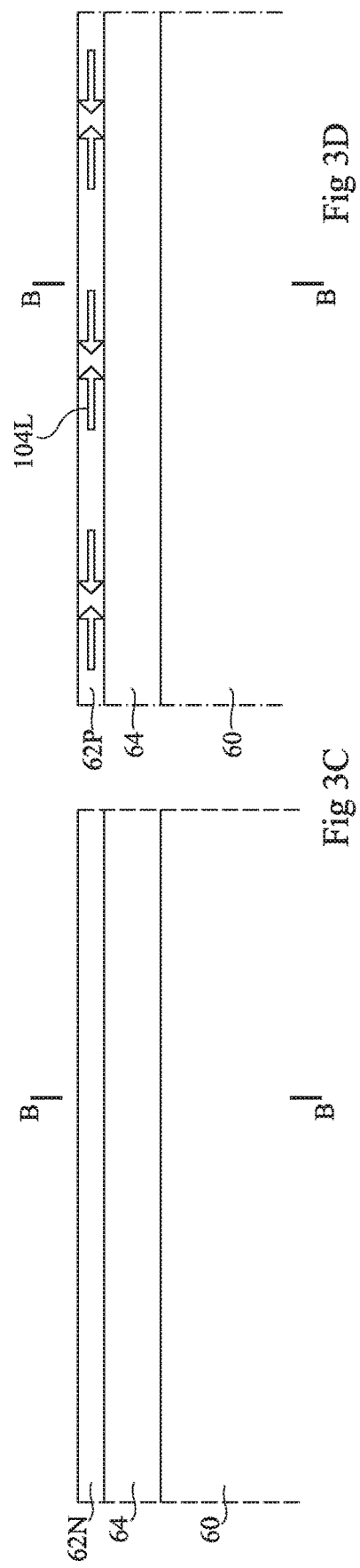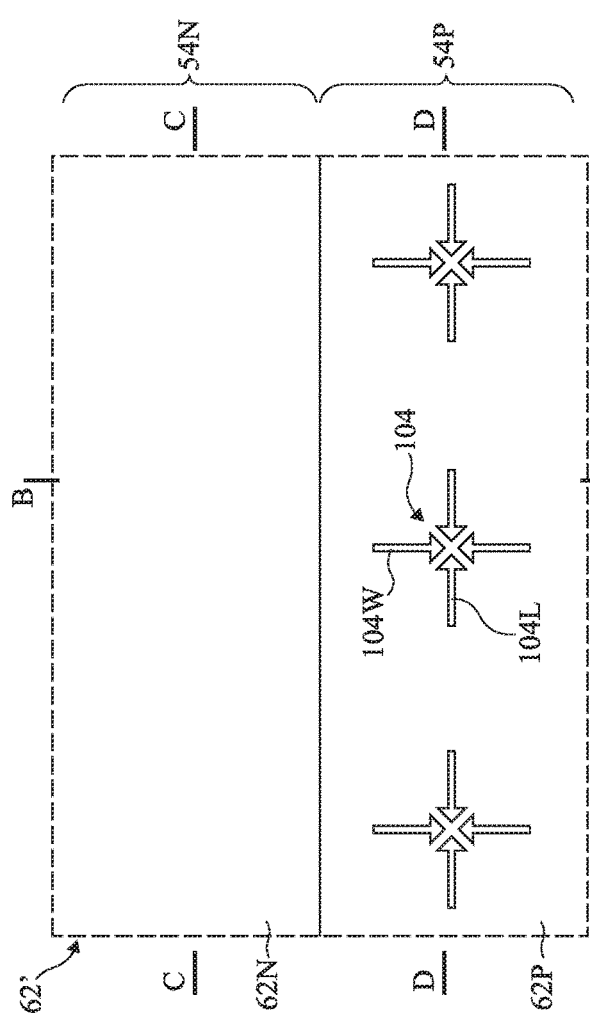

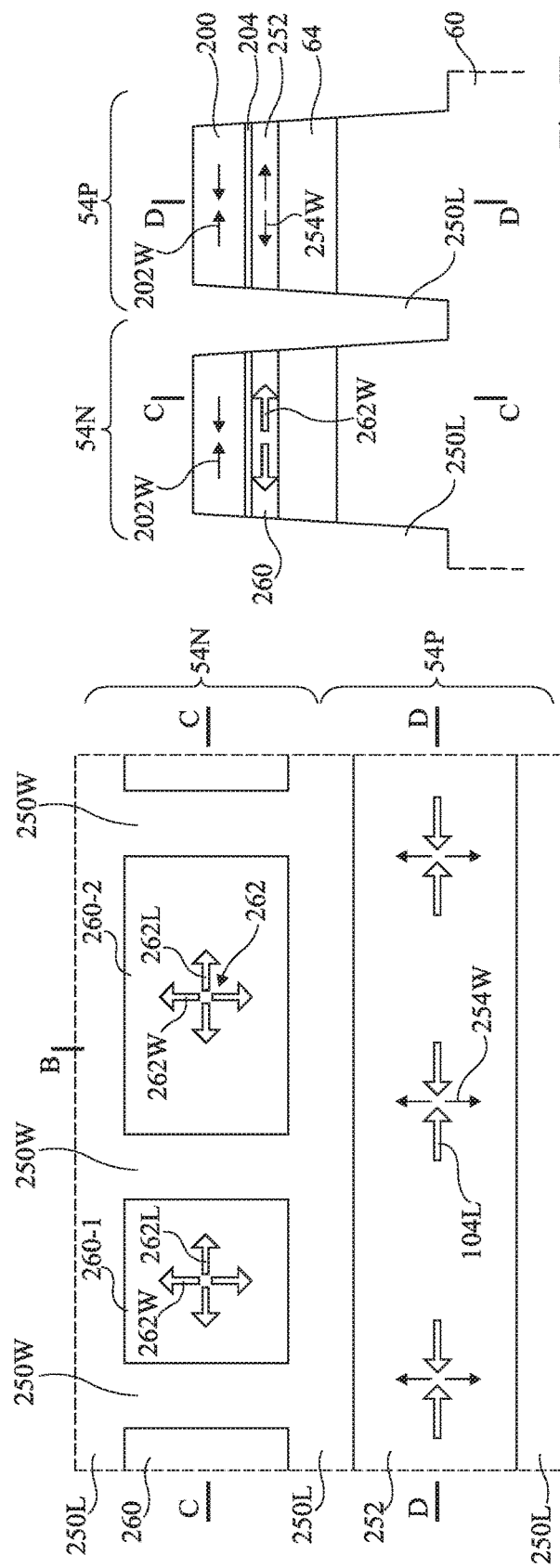

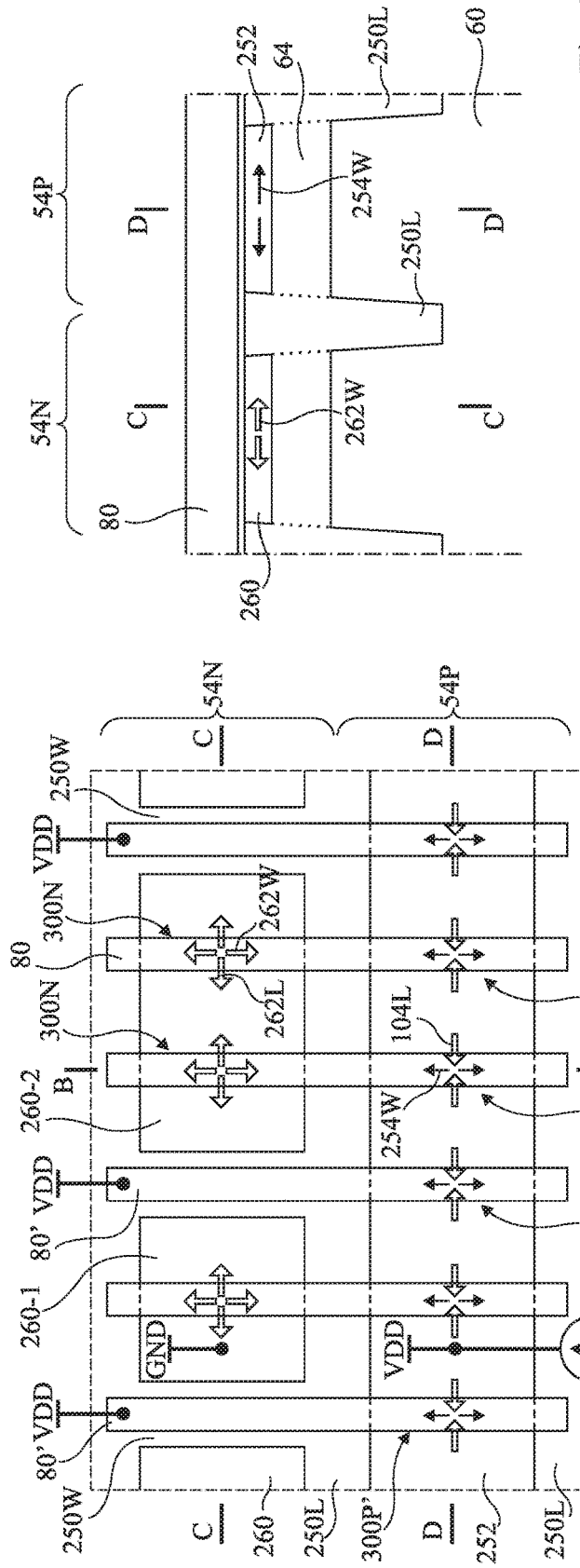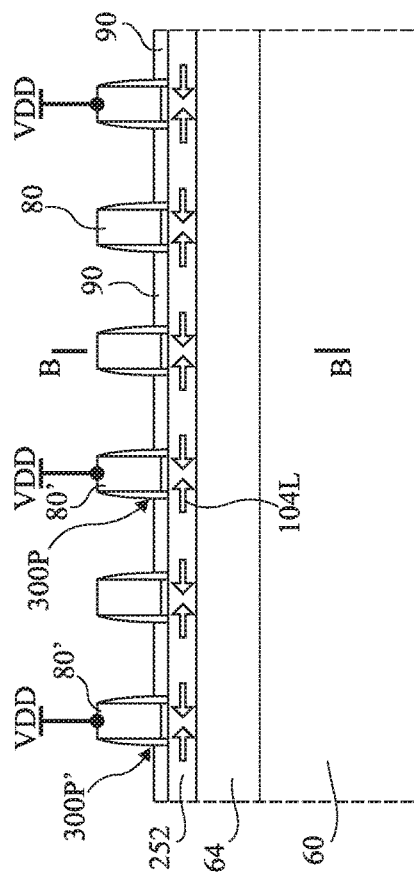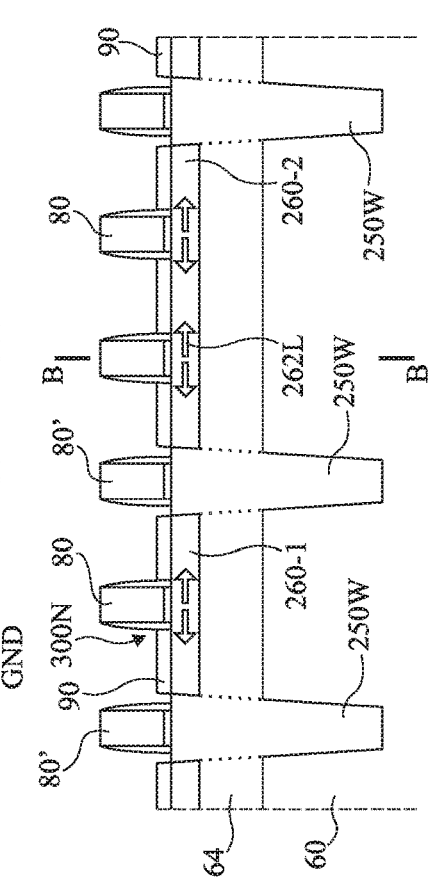

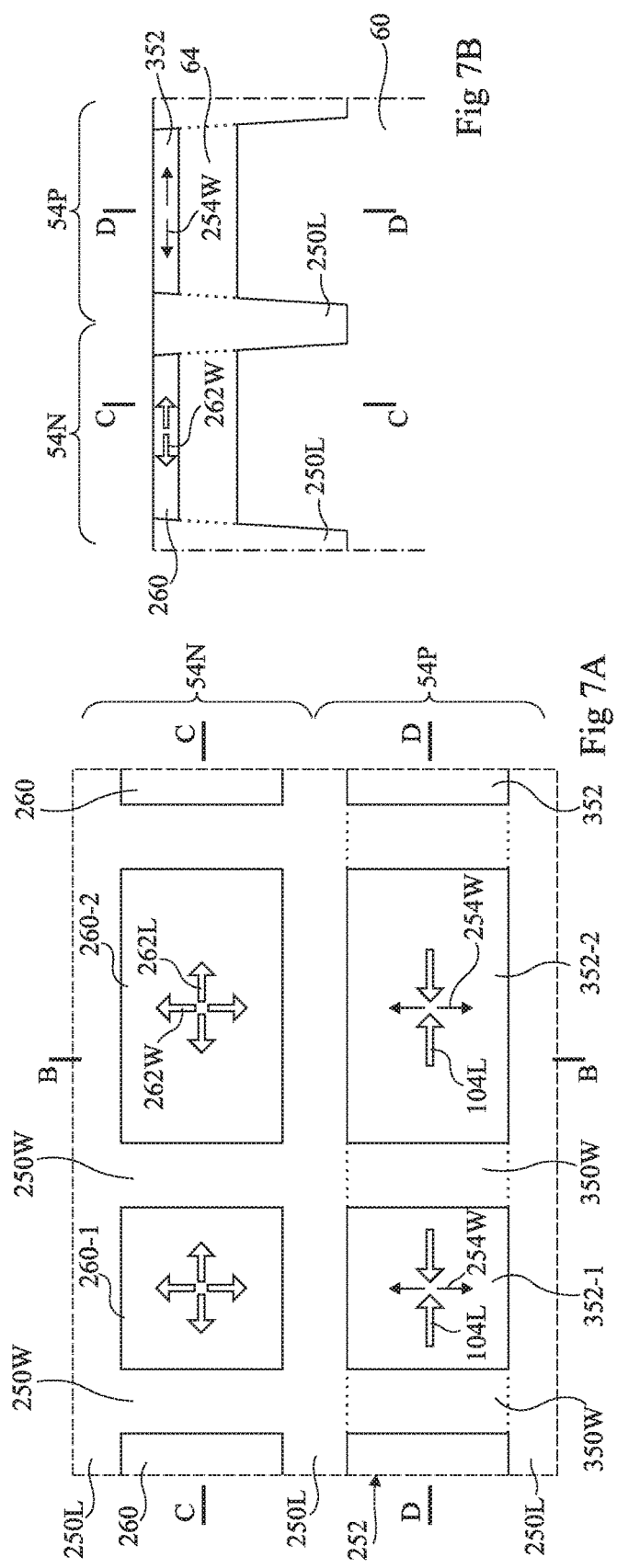
Fig 7A
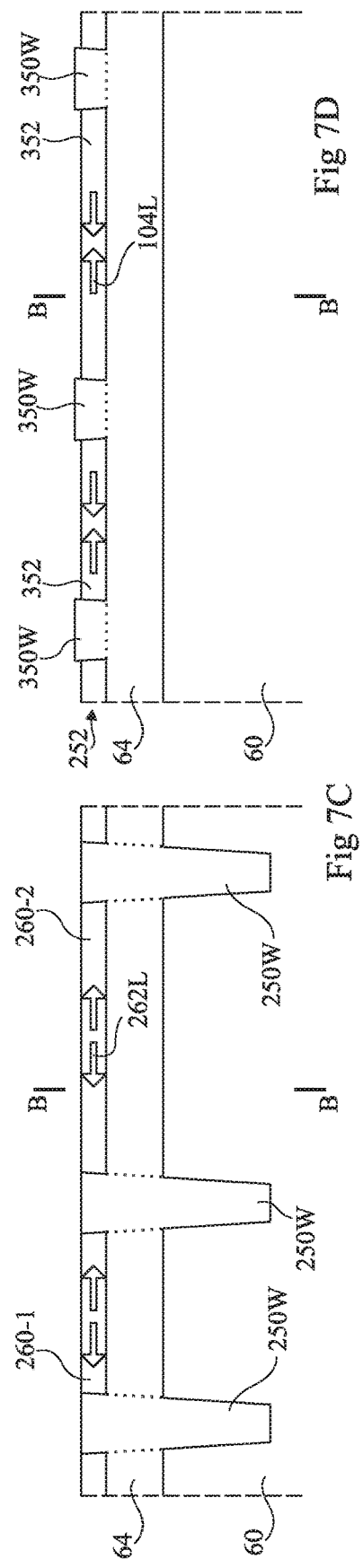
Fig 7B
Fig 7C
Fig 7D

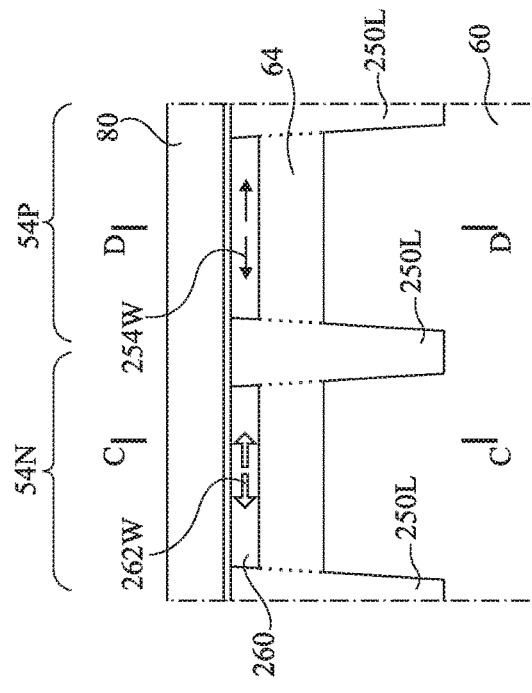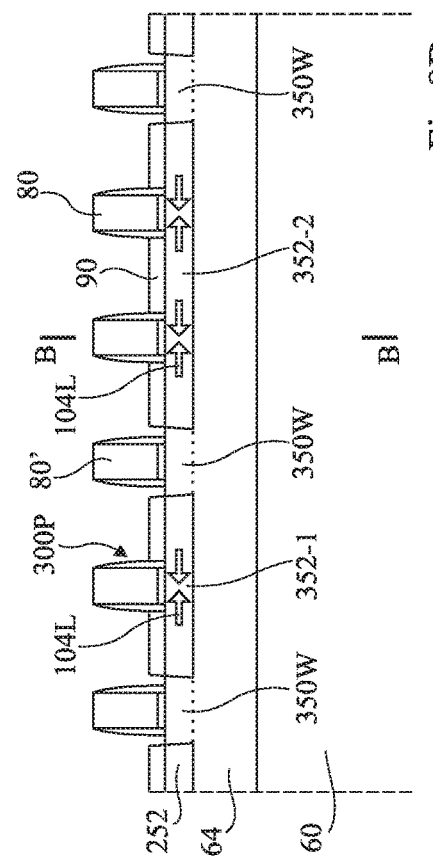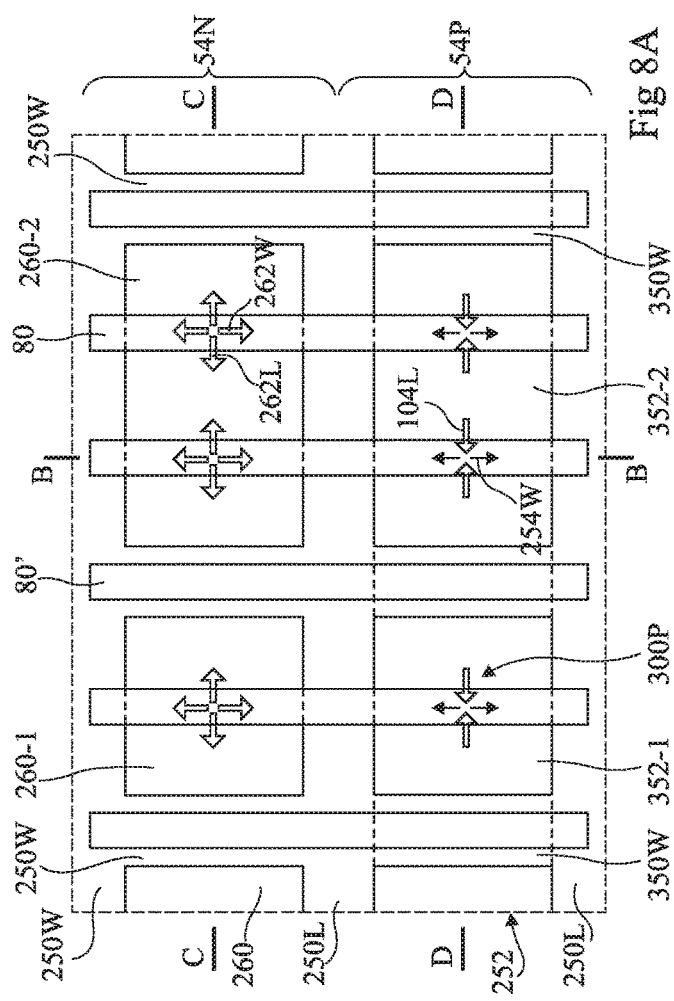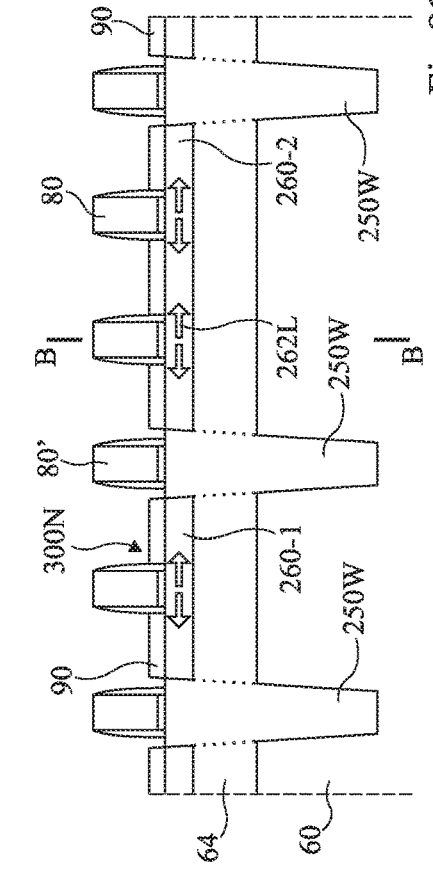
Fig 8A
Fig 8B
Fig 8C
Fig 8D

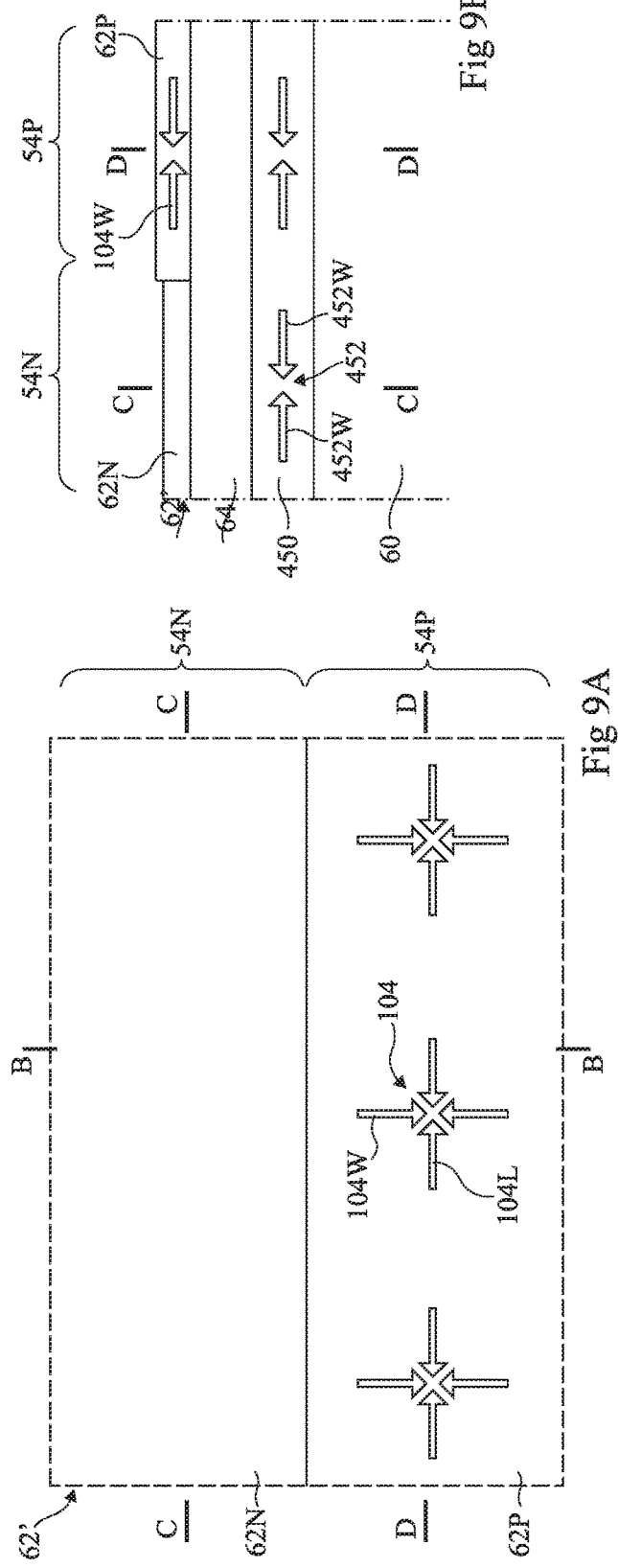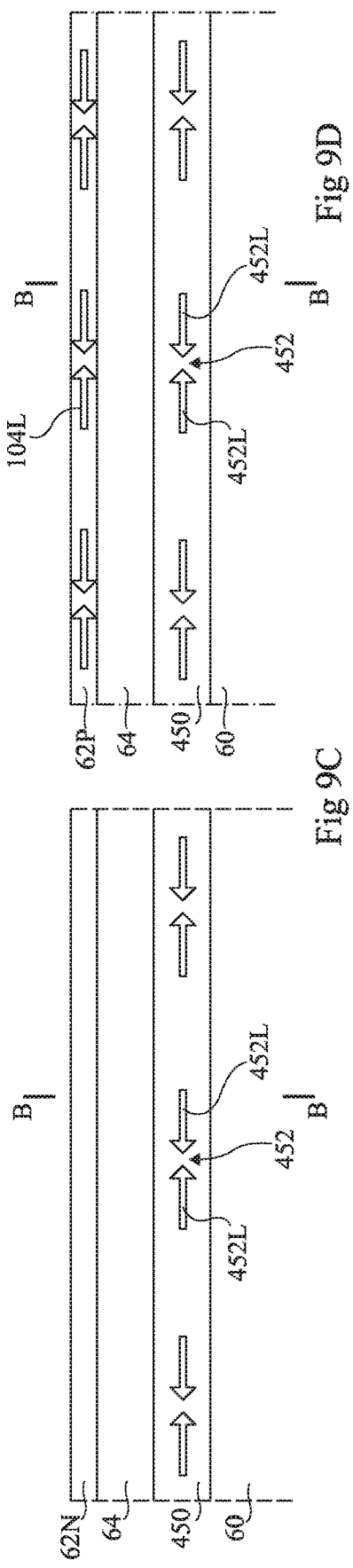

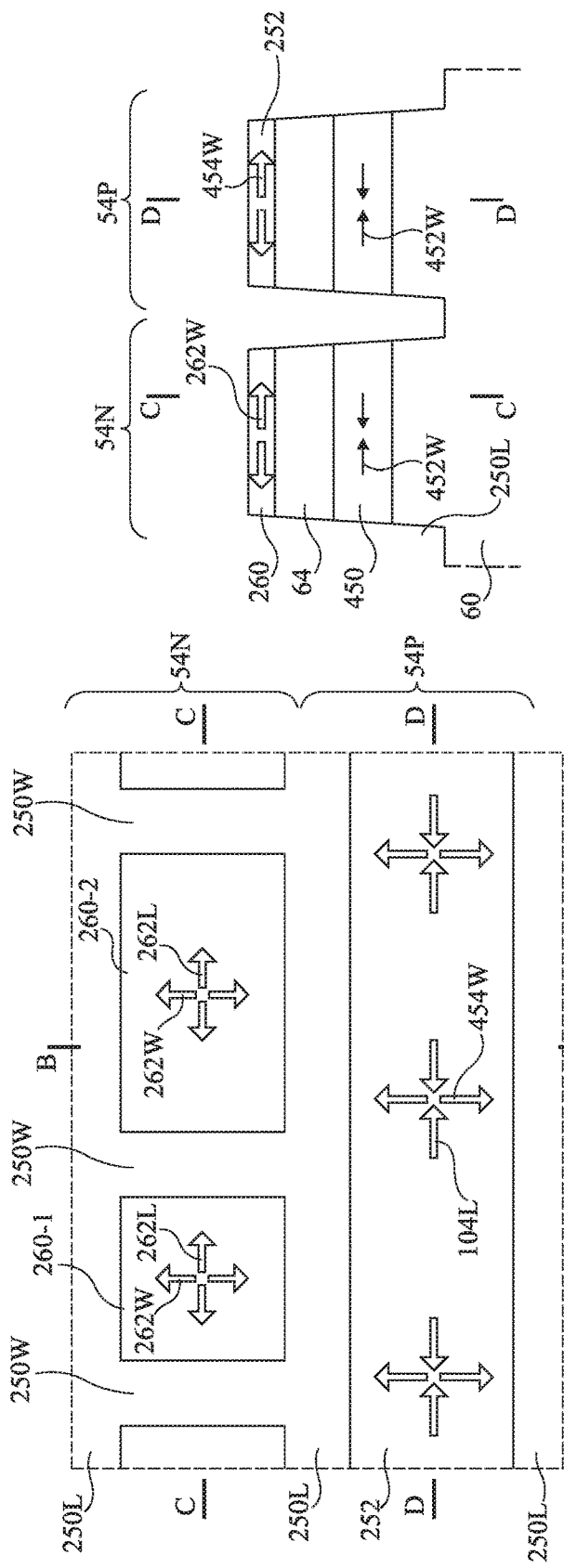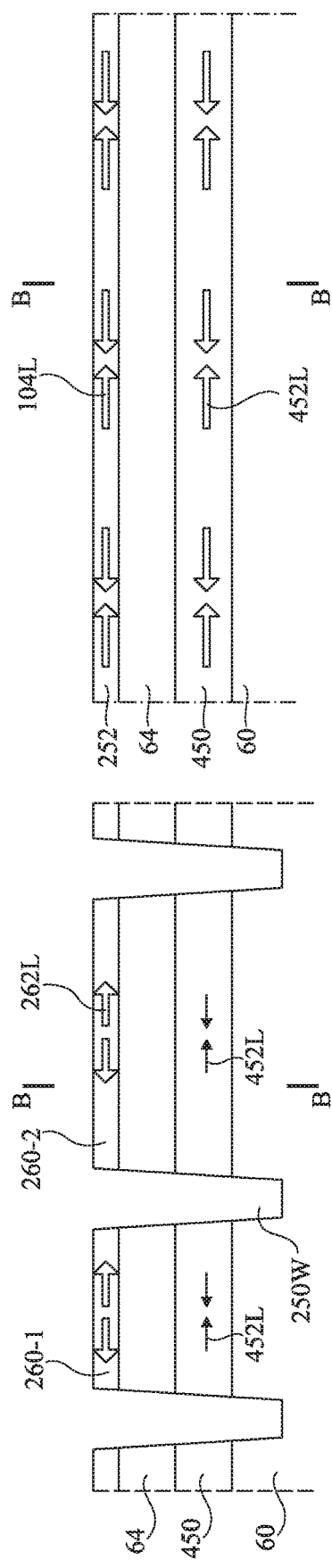
Fig 10A
Fig 10B
Fig 10C
Fig 10D

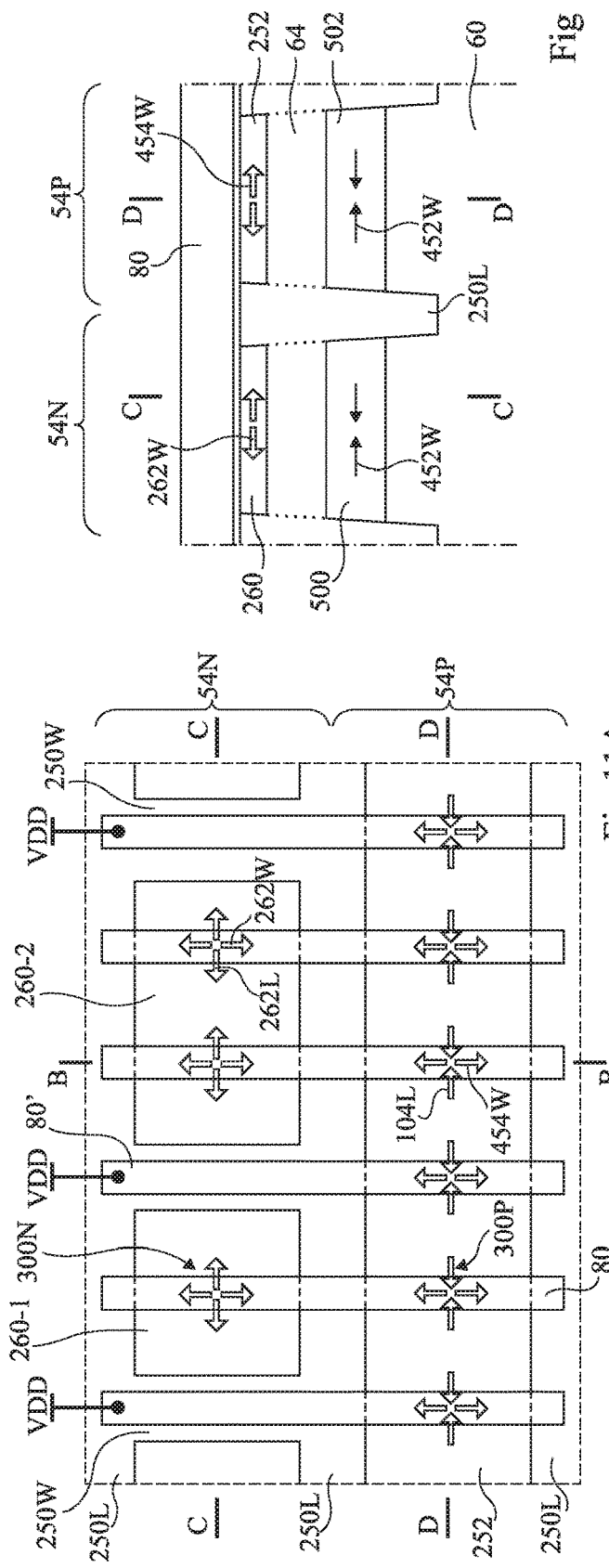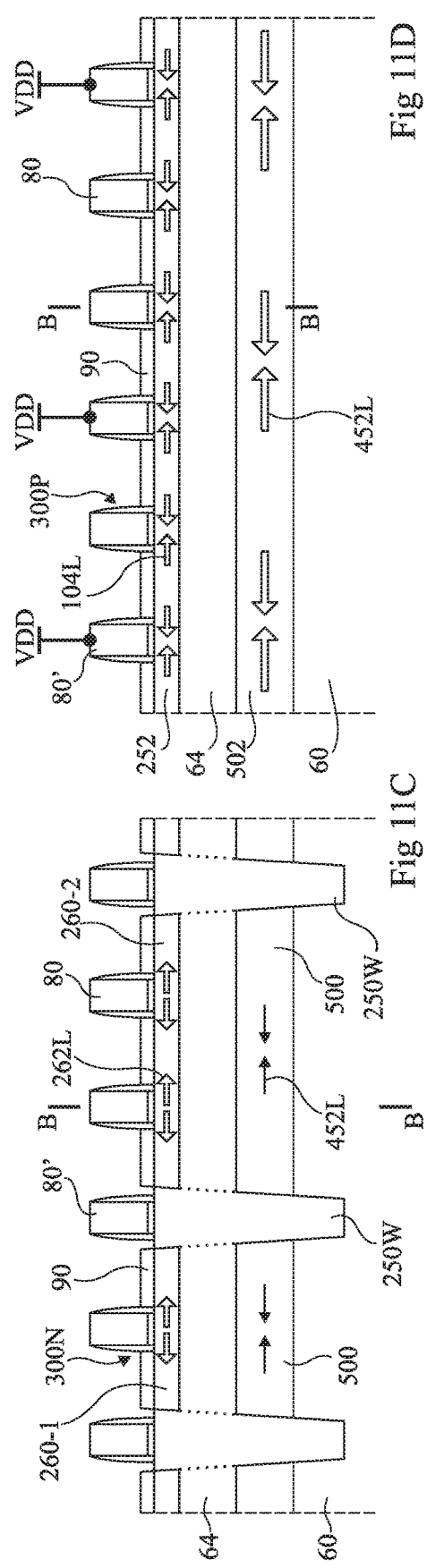

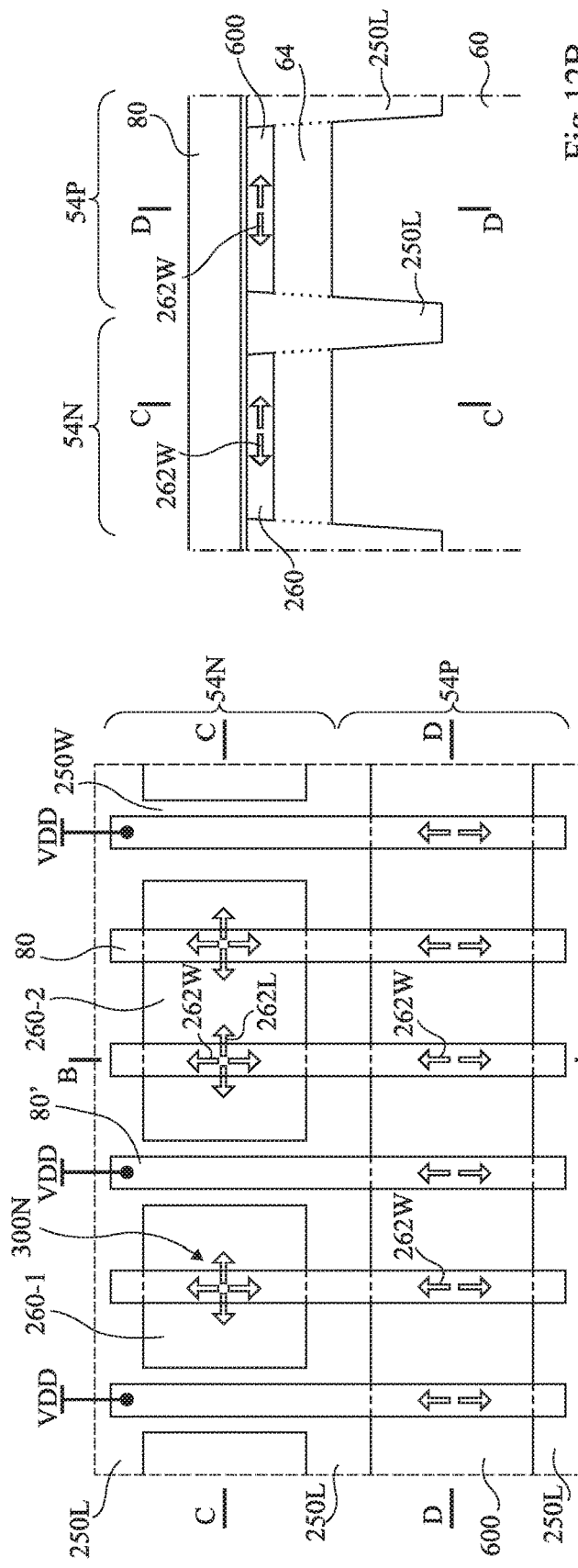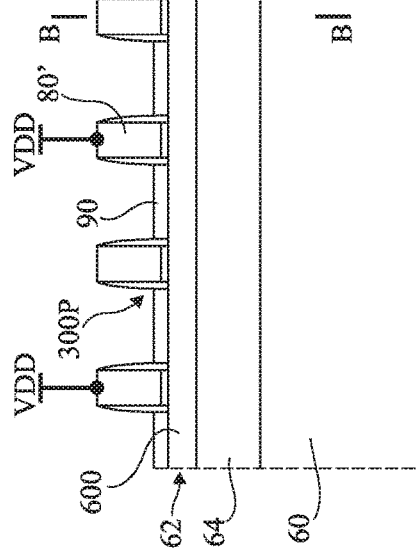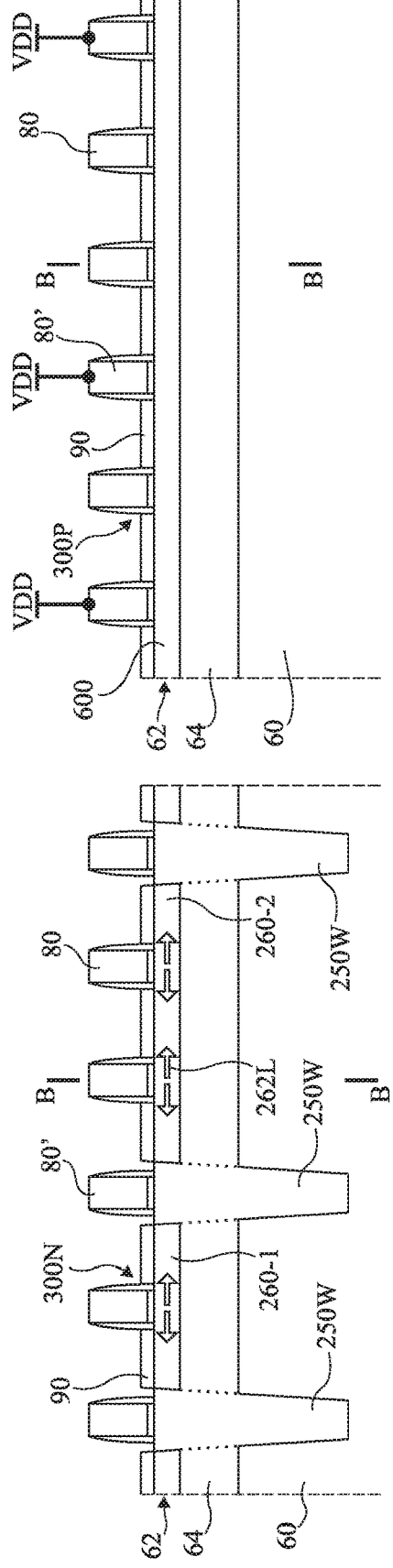

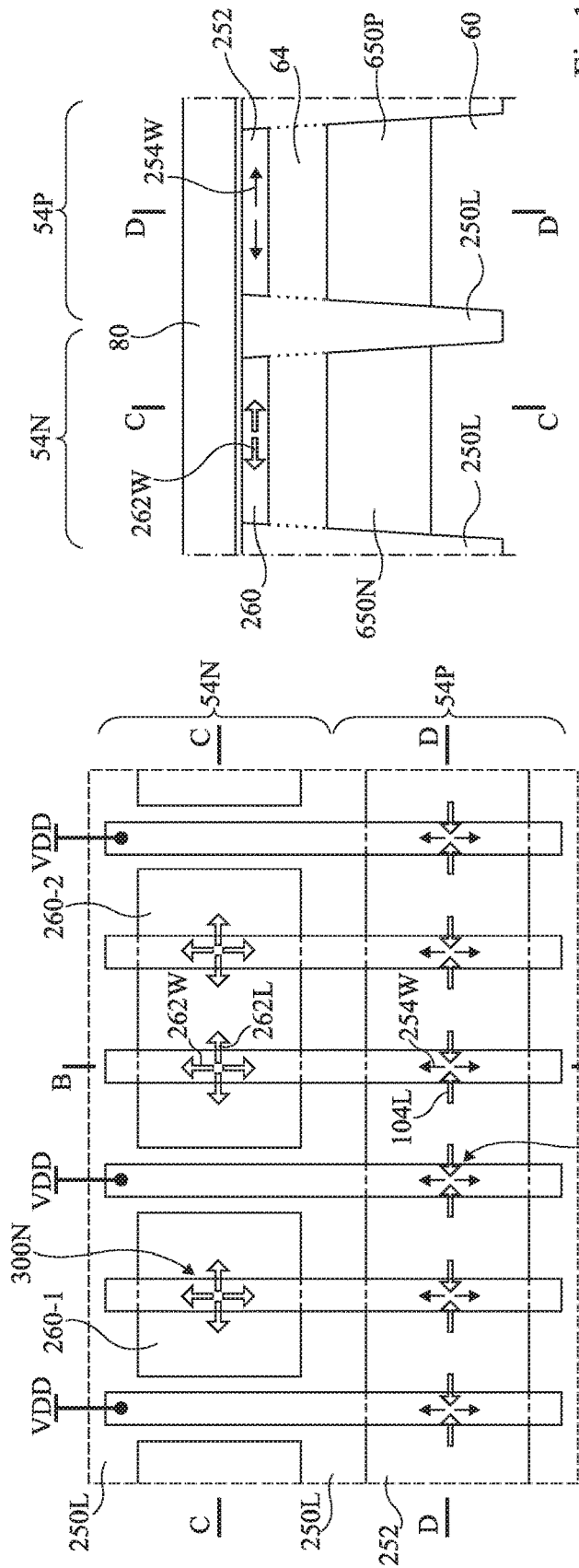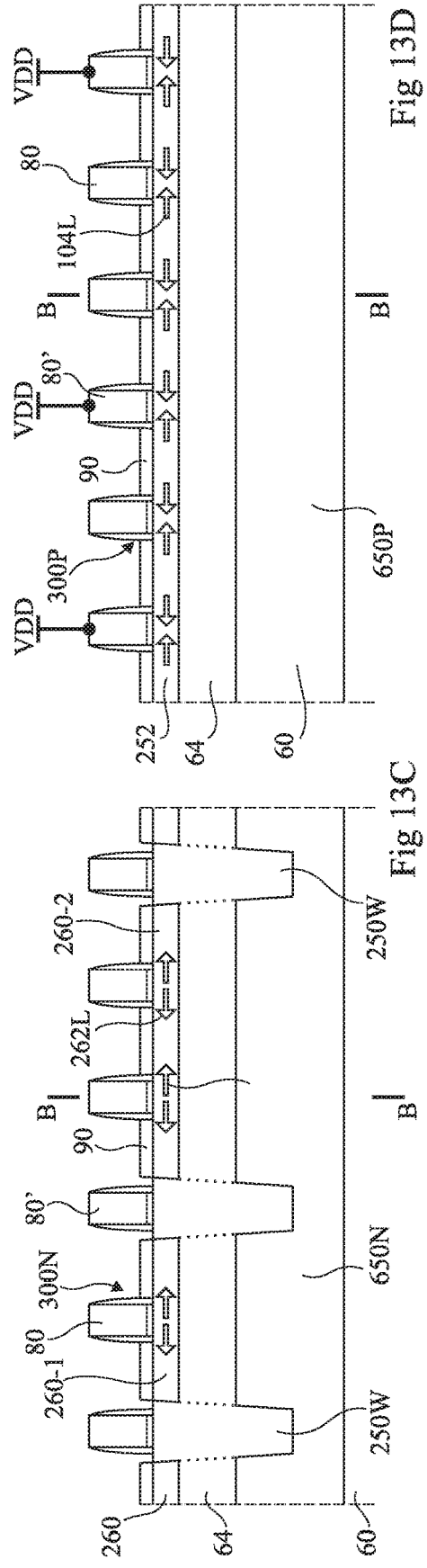

INTEGRATED CIRCUIT CHIP WITH STRAINED NMOS AND PMOS TRANSISTORS

PRIORITY CLAIM

This application is a divisional of U.S. patent application Ser. No. 15/976,452, filed May 10, 2018, which claims the priority benefit of French Patent application number 1754199, filed on May 12, 2017, the disclosures of which are hereby incorporated by reference in their entirety.

TECHNICAL FIELD

The present disclosure relates to the field of transistors, in particular, to an integrated circuit chip with N-type and P-type strained-channel MOS transistors.

BACKGROUND

The performances of certain types of MOS transistors, particularly on a structure of semiconductor-on-insulator type, SOI, may be improved by the presence of strain in the channel region.

The operation of a P-channel transistor oriented in the <110> crystal direction is accelerated when its channel region is compressively strained in the gate length direction, that is, the drain-source direction or longitudinal direction. Such a P-channel transistor is further accelerated when its channel region is tensilely strained in the transverse direction. The operation of an N-channel transistor oriented in the <110> crystal direction is accelerated when its channel region is strained with a longitudinal tension, the transverse strain having no noticeable effect. Thus, for N-channel and P-channel transistors, it is desirable to provide opposite longitudinal strain, respectively tensile and compressive.

Methods known to simultaneously form P-channel and N-channel transistors have various disadvantages, they are in particular hardly compatible with the coexistence of different strains for N-channel and P-channel types, in particular in the case of transistors having very small cross and longitudinal dimensions, for example, smaller than 500 nm.

There is a need in the art to overcome all or part of the above-described disadvantages.

SUMMARY

An embodiment provides a method of simultaneously manufacturing N-channel and P-channel MOS transistors strained differently and respectively located in first and second side-by-side strip areas. The method comprises the steps of:

a) providing, on a substrate, a compressively strained layer that is located either under or over an assembly of a semiconductor layer arranged on an insulating layer;

b) etching through the strained layer, the semiconductor layer and the insulating layers and into the substrate to form longitudinal trenches which extend between the first and second strip areas and on either side of the first and second strip areas;

c) etching through the strained layer, the semiconductor layer and the insulating layer of the first strip area and into the substrate to form transverse trenches which extending from one edge to another edge of the first strip area, which results in the formation of tensilely strained semiconductor slabs in the first strip area between the transverse trenches, and which results in the formation of a semiconductor band in the second strip area that is compressively strained in the direction of the longitudinal trenches and/or tensilely strained in the direction of the transverse trenches; and d) forming transistors inside and on top of the semiconductor slabs and inside and on top of first portions of the semiconductor band located opposite the semiconductor slabs, while leaving in place second portions of the semiconductor band located opposite the transverse trenches.

According to an embodiment, the method comprises, at step d), thermally oxidizing the second portions of the semiconductor band located opposite the transverse trenches all across a thickness of the semiconductor band.

According to an embodiment, the method comprises, at step d), forming insulated gates on the second portion of the semiconductor band located opposite the transverse trenches; connecting the transistors to a source of high and low power supply potentials; and connecting said insulated gates to a node of application of the high power supply potential.

According to an embodiment, the insulating layer is made of silicon oxide and the compressively strained layer is made of silicon nitride formed at step a) by plasma-enhanced chemical vapor deposition, the method comprising, after steps b) and c): performing a thermal treatment of relaxation of the compressively strained layer capable of at least partly keeping the strain of the semiconductor band and of the semiconductor slabs; and removing the compressively strained layer.

According to an embodiment, the substrate is made of silicon; and the strained layer is made of silicon-germanium and is grown by epitaxy at step a) on the substrate before forming the assembly of the insulating and semiconductor layers on the strained layer.

According to an embodiment, the semiconductor layer is made of silicon in the two strip areas.

According to an embodiment, the method comprises, at step a): providing a silicon layer on the insulating layer; growing by epitaxy in the second strip area a silicon-germanium layer on the silicon layer; and thermally oxidizing the structure in the second strip area, whereby said semiconductor layer is made of silicon in the first strip area and of silicon-germanium in the second strip area.

According to an embodiment, steps b) and c) are carried out simultaneously and the transverse and longitudinal trenches have the same depth.

According to an embodiment, the method comprises a step of forming a doped semiconductor well under the insulating layer in the first strip area, the longitudinal trenches extending deeper than the well, and the transverse trenches extending all the way to a level located in the well.

An embodiment provides an electronic integrated circuit chip comprising: an insulating layer on a substrate; longitudinal trenches between and on either side of first and second side-by-side strip areas, the longitudinal trenches extending through the insulating layer and into the substrate; transverse trenches extending from one edge to another edge of the first strip area and through the insulating layer and into the substrate, such that the insulating layer of the first strip area is covered, between the transverse and longitudinal trenches, with tensilely strained semiconductor slabs, and the insulating layer of the second strip area is covered, opposite the semiconductor slabs and between the longitudinal trenches, with a first portion of a semiconductor band that is compressively strained in the longitudinal direction and/or tensilely strained in the transverse direction; and N-channel MOS transistors located, in the first strip area, inside and on top of the semiconductor slabs and P-channel MOS transistors located, in the second strip area, inside and on top of said first portion of the semiconductor band.

According to an embodiment, the semiconductor band comprises, between said portions, transverse oxide bars.

According to an embodiment, the semiconductor band is fully semiconductor, insulated gates are arranged on the semiconductor band, and the transistors are connected to a source of high and low power supply potentials, said insulated gates being connected to a node of application of the high power supply potential.

According to an embodiment, the integrated circuit chip comprises under the insulating layer a buried layer made of silicon-germanium, the buried layer being compressively strained in the longitudinal direction in the second strip area.

According to an embodiment, the semiconductor slabs and the semiconductor band portions are made of silicon, the semiconductor band portions being tensilely strained in the transverse direction.

According to an embodiment, the semiconductor slabs are made of silicon and the semiconductor band portions are made of silicon-germanium compressively strained in the longitudinal direction.

According to an embodiment the transverse and longitudinal trenches have the same depth.

According to an embodiment, a doped semiconductor well is located in the first strip area under the insulating layer; the longitudinal trenches extend deeper than the well; and the transverse trenches extend all the way to a level located in the well.

BRIEF DESCRIPTION OF THE DRAWINGS

The foregoing and other features and advantages will be discussed in detail in the following non-limiting description of dedicated embodiments in connection with the accompanying drawings, wherein:

FIGS. 1A to 1D partially and schematically show an integrated circuit chip comprising N-channel and P-channel transistors;

FIGS. 2A to 2D, 3A to 3D, 4A to 4D, 5A to 5D, and 6A to 6D schematically illustrate steps of an embodiment of a method of simultaneously manufacturing N-channel and P-channel transistors strained differently;

FIGS. 7A to 7D and 8A to 8D schematically illustrate steps of another embodiment of a method of simultaneously manufacturing N-channel and P-channel transistors strained differently;

FIGS. 9A to 9D, 10A to 10D, and 11A to 11D schematically illustrate steps of another embodiment of a method of simultaneously manufacturing N-channel and P-channel transistors strained differently;

FIGS. 12A to 12D schematically illustrate a step of another embodiment of a method of simultaneously manufacturing N-channel and P-channel transistors strained differently; and FIGS. 13A to 13D schematically illustrate a step of another embodiment of a method of simultaneously manufacturing N-channel and P-channel transistors strained differently.

DETAILED DESCRIPTION

Figure 4A:
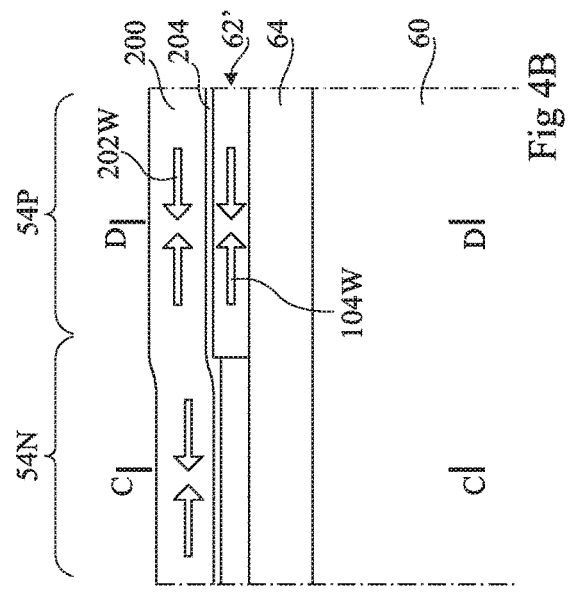

The same elements have been designated with the same reference numerals in the various drawings and, further, the various drawings are not to scale. For clarity, only those steps and elements which are useful to the understanding of the described embodiments have been shown and are detailed. In particular, circuits formed of transistors are not described or shown in detail, and details of certain steps, such as the forming and the removal of masking layers, are neither described nor shown, since such details can be deduced by those skilled in the art based on the indications of the present description.

In the following description, when reference is made to position-qualifying terms, such as term "left", "right", reference is made to the orientation of the concerned element in the cross-section views.

FIGS. 1A to 1D schematically show a portion of an integrated circuit chip 50. FIG. 1A is a top view, FIG. 1B is a transverse cross-section view (plane B-B), and FIGS. 1C and 1D are longitudinal cross-section views (planes C-C and D-D). Transistors 52N and transistors 52P are located in top view respectively in longitudinally-extending side-by-side strip areas 54N and 54P, the cross-section plane C-C of FIG. 1C running through transistors 52N and the cross-section plane D-D of FIG. 1D running through transistors 52P. As an example, three transistors are shown in each strip area.

The integrated circuit chip comprises an SOI-type structure, that is, on a substrate 60, a bilayer comprising a semiconductor layer 62 on an electrically-insulating layer 64. Insulating trenches 70L extend longitudinally between strip areas 54P and 54N and on either side of strip areas 54P and 54N. Insulating trenches 70W extend transversely in the two strip areas. From the upper surface of the SOI structure, longitudinal and transverse trenches 70L and 70W cross semiconductor and insulating layers 62 and 64 and stop in substrate 60. Trenches 70L and 70W are filled with an electric insulator. Trenches 70L and 70W thus insulate, in semiconductor layer 62, semiconductor slabs (or active areas) 72N in strip area 54N and semiconductor slabs 72P in strip area 54P, slabs 72P being arranged opposite slabs 72N.

Insulated gate structures 80, comprising a gate insulator 82 and spacers 84, are arranged on the two slabs and extend in the transverse direction on the two strip areas. The gate structures are repeated longitudinally with a regular pitch. The positions of transverse trenches 70W are provided so that some of the gate structures are located on these trenches without being in contact with the slabs. The other gate structures each form the two interconnected gates of a transistor 52N and of a transistor 52P facing each other. As an illustration, a pair of opposite slabs 72N-1 and 72P-1, having a pair of transistors 52P-52N formed therein and thereon, has been shown on the left-hand side of FIGS. 1A, 1C, and 1D, and a pair of opposite slabs 72N-2 and 72P-2 having two pairs of transistors 52P-52N formed therein and thereon has been shown on the right-hand side. As an example, epitaxial drain-source regions 90 are located on the slabs on either side of the gates.

Logic circuits are formed from opposite transistors 52N and 52P. These circuits are powered, by a power supply source 92, between a high potential VDD and a low potential, for example, a ground GND. As an example, an inverter is shown on the left-hand side of FIG. 1A between nodes IN and OUT. Another logic circuit, not shown, is formed form transistors 52N and 52P of slabs 72N-2 and 72P-2. These neighboring logic circuits are insulated by transverse trenches 70W.

It is here desired to obtain an integrated circuit chip having circuits faster than those of integrated circuit chip 50, the circuits comprising, as those of integrated circuit chip 50, P-channel and N-channel transistors located opposite each other in side-by-side strip areas. To achieve this, it is desired to simultaneously obtain transistors with an N-channel tensilely strained in the longitudinal direction, and with a P-channel compressively strained in the longitudinal direction and/or in tensilely strained in the lateral direction.

Figure 4B:
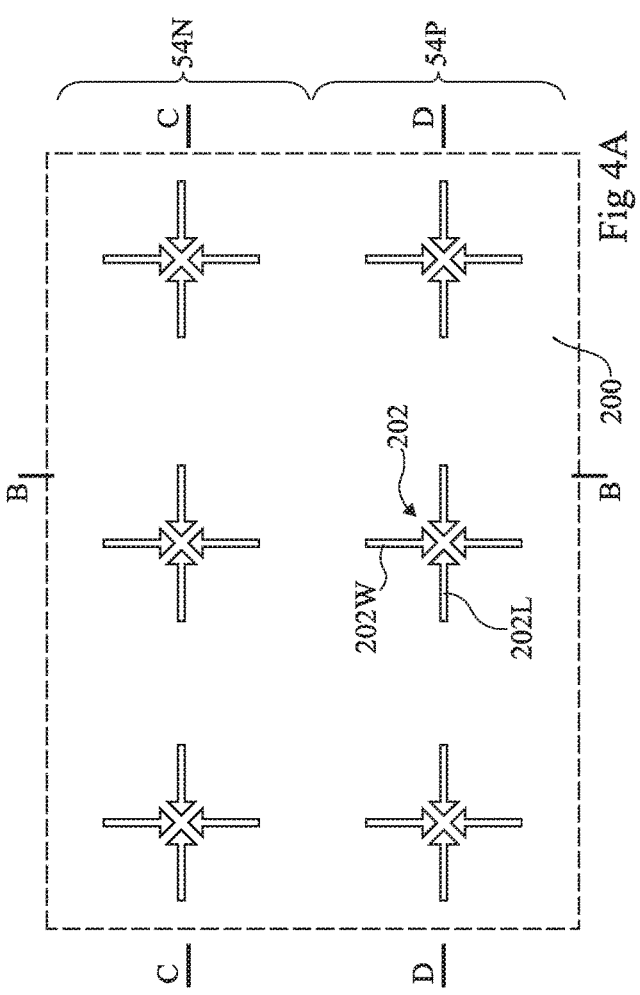
Figure 4C:
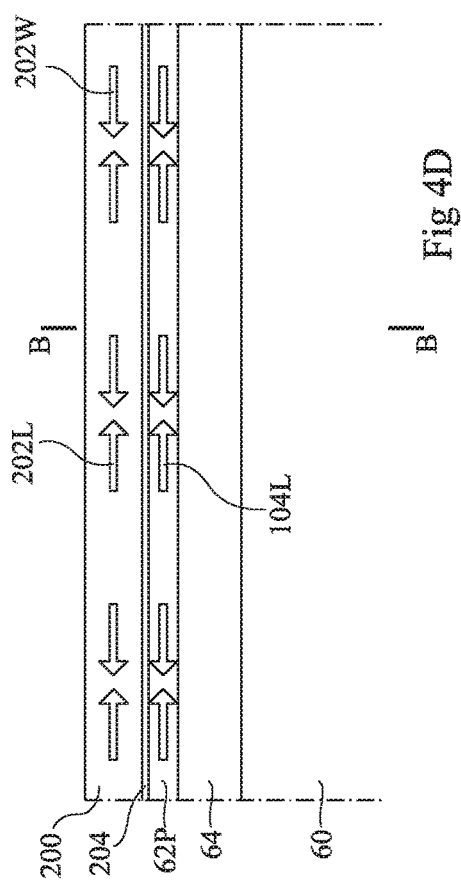
Figure 4D:
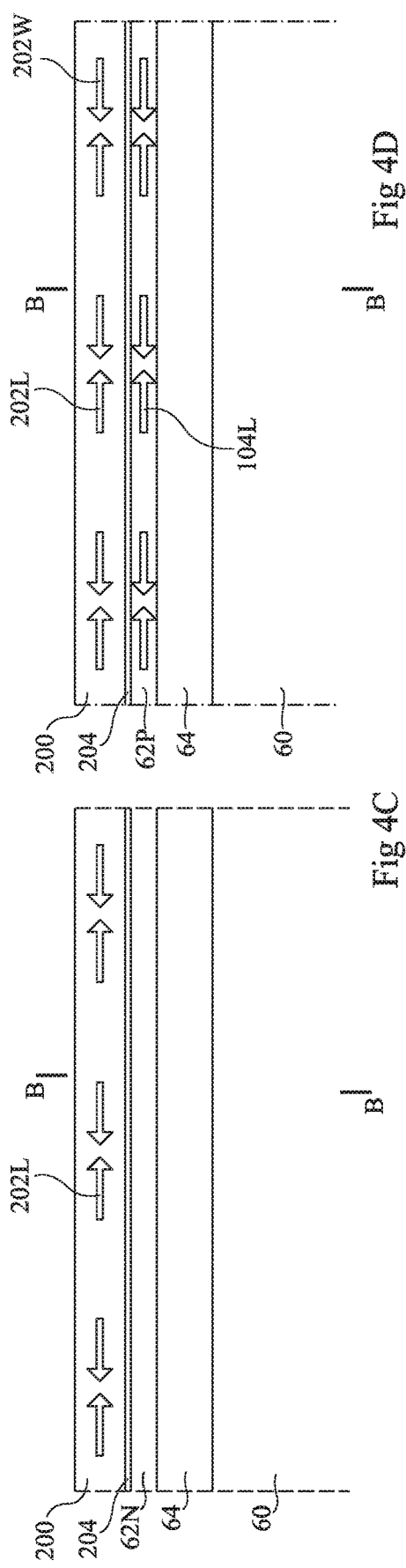

In the following description, the drawings simultaneously illustrate steps of various embodiments of methods of simultaneously manufacturing of strained N-channel and strained P-channel transistors respectively located in side-by-side strip areas 54N and 54P. FIGS. 2A to 13A are top views, FIGS. 2B to 13B are cross-section views in a transverse plane B-B running through the location of transistors, FIGS. 2C to 13C are cross-section views in a longitudinal plane C-C running through the location of N-channel transistors, and FIGS. 2D to 13D are cross-section views in a longitudinal plane D-D running through the location of P-channel transistors.

First Embodiment

FIGS. 2A to 2D, 3A to 3D, 4A to 4D, 5A to 5D, and 6A to 6D schematically illustrate steps of an embodiment of a method of simultaneously manufacturing N-channel and P-channel transistors strained differently.

At the step of FIGS. 2A to 2D, an SOI-type structure comprising, on a substrate 60, for example made of silicon, the assembly of a semiconductor silicon layer 62 on an insulating layer 64, for example, made of silicon oxide, is first provided. The structure is preferably an FDSOI-type ("Fully Depleted Silicon On Insulator") structure, that is, where semiconductor layer 62 has a thickness in the range from 3 to 10 nm, preferably from 5 to 8 nm. As an example, insulating layer 64 has a thickness in the range from 10 to 25 nm.

As described in relation with FIGS. 1A to 1D, the structure is divided into strip areas 54N and 54P. In strip area 54N, a silicon nitride masking layer 100 is deposited on layer 62. Layer 100 does not cover strip area 54P. An epitaxy of a layer 102 of silicon-germanium SiGe on layer 62 is then performed in strip area 54P. Layer 102 is submitted to compressive strain 104, the strain having a longitudinal component 104L and a transverse component 104W. The strain is due to the lattice mismatch between the SiGe and the silicon of layer 62. As an example, SiGe layer 102 comprises from 15% to 40% of germanium. The thickness of SiGe layer 102 is for example in the range from 5 to 10 nm.

At the step of FIGS. 3A to 3D, a thermal oxidation of SiGe layer 102 is carried out. This transfers into silicon layer 62 the germanium and strain 104, and forms on layer 62 an oxide layer which will be removed afterwards. Masking layer 100 is also removed. The obtained semiconductor layer 62' has, in strip area 54N, a silicon portion 62N and, in strip area 54P, a SiGe portion 62P compressively strained in the transverse and longitudinal directions. The strain 104 of the portion of SiGe layer 62' is for example in the range from 0.5 to 3 GPa.

At the step of FIGS. 4A to 4D, a silicon nitride layer 200 is formed all over layer 62'. Layer 200 is for example formed by plasma-enhanced chemical vapor deposition PECVD, to obtain compressive strain 202 in layer 200. The strain has a longitudinal component 202L and a transverse component 202W. As an example, layer 200 has a thickness in the range from 20 to 100 nm. It is preferably provided, before the forming of layer 200, to form an oxide layer 204 all over layer 62'. The thickness of layer 204 is for example in the range from 1 to 3 nm.

At the step of FIGS. 5A to 5D, longitudinal trenches 250L are etched on either side of strip areas 54N and 54P. Transverse trenches 250W are further etched between trenches 250L from one side to the other of strip area 54N. Transverse trenches 250W are limited to strip area 54N only, and do not extend all the way to strip area 54P, unlike trenches 70W of the integrated circuit chip of FIG. 1. From the upper surface of the structure, trenches 250L and 250W cross strained silicon nitride layers 200, optional layer 204, semiconductor layer 62', and insulating layer 64 across their entire thickness, and penetrate into substrate 60.

In strip area 54P, due to the fact that the transverse trenches do not extend in strip area 54P, a band 252 of layer 62' has been left intact. In this band, the longitudinal compressive strain 104L initially present in layer 62' is not modified by the etching. Due to the presence of the longitudinal trenches on either side of strip area 54P, the transverse compressive strain 104W is released. Further, in layer 200, transverse compressive strain 202W is released by a widening of layer 200. Such a widening stretches band 252 transversely, which helps releasing transverse compressive strain 104W, or may even create transverse tensile strain 254W in band 252.

In strip area 54N, semiconductor slabs 260 surrounded with trenches 250L and 250P have thus been formed from semiconductor layer 62'. A slab 260-1 intended for the forming of a transistor and a slab 260-2 intended for the forming of two transistors have been shown. Due to the fact that the trenches surround each of slabs 260, transverse and longitudinal tensile strain 262, respectively 262W and 262L in each of the slabs has been created. Indeed, on each of slabs 260, transverse and longitudinal compressive strain 202W and 202L is released by a transverse and longitudinal lengthening of layer 200. Such a lengthening stretches slab 260 in the transverse and longitudinal directions.

As an example, slabs 260 and strip area 252 have cross dimensions smaller than 1 μm. The slabs for example have longitudinal directions smaller than 1 μm. The trenches for example have a depth in the range from 100 to 300 nm.

At the step of FIGS. 6A to 6D, a thermal treatment of relaxation of silicon nitride layer 200 is first carried out. The temperature and the duration of the thermal treatment are provided to suppress the strain of layer 200, and thus to transfer the deformation of layer 200 and generate tensile strain 262L, 262W in slabs 260, and 254W in band 252, while maintaining at least part of strain 104L in band 252. This is made possible by the flowing of silicon oxide layer 64 under the slabs and by the fact that the trenches cross layer 200. As an example, the thermal treatment is carried out at a temperature in the range from 1,000° C. to 1,200° C. for a duration in the range from 1 to 30 min.

After the thermal treatment, the remainders of layer 200 are removed. Due to the fact that layer 200 is strongly relaxed, such a removal has little effect upon strain 104L and 254W of band 252 and on strain 262L and 262W of slabs 260. Further, trenches 250L and 250W are filled with an insulator, for example, with silicon oxide.

The transistors are then formed. To achieve this, insulated gate structures 80, extending in the transverse direction on the two strip areas 54N and 54P and longitudinally repeated with a regular pitch, are formed. As an example, the positions of transverse trenches 250W are provided so that some 80' of gate structures 80 are located on the trenches between slabs 260 and have no contact with the slabs. In strip area 54P, gate structures 80' are located on band 252. Each of the other gate structures forms the two interconnected gates of a transistor 300N and of a transistor 300P opposite each other. As an example, epitaxial drain-source regions 90 located on slabs 260 and on band 252 on either side of the gates are provided.

Due to the fact that transverse trenches 250W have been etched, transistors 300N have an N-channel tensilely strained in the longitudinal direction. Due to the fact that the portions of the strained semiconductor band aligned with transverse trenches 250W have been left in place, transistors 300P have a P channel compressively strained in the longitudinal direction.

Circuits, not shown, similar to those described in relation with FIG. 1 are then formed. In the example of the shown structure, a circuit comprising transistor 300N of slab 260-1 and the opposite transistor 300P, and a neighboring circuit comprising the two transistors 300N of slab 206-2 and the two opposite transistors 300P are formed. In particular, as shown in FIG. 6A for one of the circuits, the sources of transistors 300N are connected to ground GND and the sources of transistors 300P are connected to a node of application of potential VDD supplied by a power supply source 92.

Gate structures 80' are connected to a node of application of potential VDD or, as a variation, of a potential greater than potential VDD. This enables to insulate from one another neighboring circuits, by blocking the transistors 300P' formed by gates 80' on band 252.

According to an advantage, due to the fact that the obtained circuits comprise transistors with an N channel tensilely strained in the longitudinal direction, and transistors with a P channel compressively strained in the longitudinal direction, the circuits are particularly fast.

Second Embodiment

FIGS. 7A to 7D and 8A to 8D schematically illustrate steps of a second embodiment of a method of simultaneously manufacturing strained N-channel and strained P-channel transistors.

At the step of FIGS. 7A to 7D, the following steps have first been implemented:
the steps of FIGS. 2A to 2D and 3A to 3D of forming a portion 62P made of SiGe in the semiconductor layer 62 of an SOI structure;
the steps of FIGS. 4A to 4D of forming a strained layer 200 on the semiconductor layer; and
the trench etching steps of FIGS. 5A to 5D.

The thermal relaxation treatment has been carried out, the remainders of layer 200 have been removed, and trenches 250L and 250W have been filled, in a way similar to what has been described in relation with FIGS. 6A to 6D.

The portions of band 252 located opposite transverse trenches 250W, that is, aligned with the transverse trenches, are then thermally oxidized across the entire width and the entire thickness of band 252. This results in transverse thermal oxide bars 350W in band 252.

Due to the fact that during the oxidation, the concerned portions of band 252 have not been etched and have remained in place, no free edges have been created in the band and the longitudinal compressive strain 104L initially present in the band is maintained. Band 252 comprises SiGe portions 352 longitudinally compressed 104L between bars 350W, portions 352 being located opposite slabs 260. As an illustration, a portion 352-1 opposite slab 260-1 and a portion 352-2 opposite slab 260-2 have been shown. Further, the thermal oxidation modifies neither the transverse strain 254W of band 252, not strain 262L and 262W in slabs 260 of band 54N.

At the step of FIGS. 8A to 8B, the transistors and the circuits (not shown) are formed in a way similar to that described in relation with FIGS. 6A to 6D, with the difference that gates 80' are not necessarily connected to a node of application of potential VDD or of a potential greater than potential VDD. A structure similar to that illustrated in FIGS. 6A to 6D is obtained, with the difference that, in band 54P, gate structures 80' are located on oxide bars 350W.

In the structure thus obtained, neighboring circuits, that is, in the illustrated example, a circuit comprising the transistors of slabs 260-1 and 352-1 and a circuit comprising the transistors of slabs 260-2 and 352-2, are insulated from each other, in strip area 54P, by bars 350W and, in strip area 54N, by trenches 250W. This keeps the advantage of particularly fast circuits.

Third Embodiment

FIGS. 9A to 9D, 10A to 10D, and 11A to 11D schematically illustrate steps of a third embodiment of a method of simultaneously manufacturing N-channel and P-channel transistors strained differently.

At the step of FIGS. 9A and 9B, steps similar to those of FIGS. 2A to 2D and 3A to 3D of forming a strained SiGe portion in the semiconductor layer of a SOI structure are implemented, with the difference that a strained SiGe layer 450 located on a silicon substrate 60 has been previously provided in the SOI structure. The assembly of conductive layer 62 on insulating layer 64 is then located on SiGe layer 450.

Such an SOI structure with a buried strained SiGe layer may be obtained as follows. SiGe is first epitaxially grown on the substrate. Such an epitaxy results in compressive, longitudinal, and transverse strain 452, 452L, and 452W, due to the lattice mismatch between the substrate silicon and the SiGe. One then forms, on strained layer 450, the assembly of semiconductor layer 62 on insulating layer 64, in a known way similar to that implemented to obtain a SOI structure on a substrate which is not covered with a strained layer. As an example, layer 450 comprises from 20 to 60% of germanium. The obtained strain 452 is for example in the range from 1.3 to 3.5 GPa. Layer 450 may have a thickness for example in the range from 10 to 40 nm. The thicknesses of the insulating and semiconductor layers are for example the same as those of the first embodiment.

Thus, the structure obtained at the step of FIGS. 9A to 9D comprises, under the insulating layer, strained layer 450, and on the insulating layer, a semiconductor layer 62'. Layer 62' corresponds to that obtained at the step of FIGS. 3A to 3D, that is, it comprises, in strip area 54N, a silicon portion 62N and, in strip area 54P, a SiGe portion 62P submitted to compressive, longitudinal, and transverse strain 104, 104L, and 104W.

At the step of FIGS. 10A to 10D, trenches 250W and 250L similar to the trenches etched at the step of FIGS. 5A to 5D are etched, in particular, transverse trenches 250W are limited to strip area 54N only, and do not extend all the way to strip area 54P. Trenches 250W and 250L thoroughly cross semiconductor, insulating, and strained layers 62', 64, and 450, and penetrate into substrate 60.

In strip area 54P, a band 252 submitted to longitudinal compressive strain 104L has been formed, as in the first embodiment. Due to the presence of the longitudinal trenches on either side of strip area 54P, the transverse compressive strain 104W is released. Further, in layer 450, transverse compressive strain 452W is released, and such a release goes along with a widening of layer 450. This transversely stretches band 252 and creates transverse tensile strain 454W therein. This is made possible by the fact that buried strained SiGe layer 450 has a thickness and a germanium concentration greater than those of portion 62P of layer 62'. As an example, strain 454W is greater than 0.5 GPa. It should further be noted that, in strip area 54P, longitudinal compressive strain 452L of buried strained layer 450 is not released.

In strip area 54N, semiconductor slabs 260 surrounded with trenches 250L and 250W have been obtained, as in the first embodiment. The slabs are submitted to transverse and longitudinal tensile strain 262, respectively 262W and 262L. Strain 452 of layer 450 is partly released in strip area 54N.

At the step of FIGS. 11A to 11D, the trenches are filled, the transistors are formed, and the circuits (not shown) are formed as described in relation with FIGS. 6A to 6D. A structure similar to that of FIGS. 6A to 6D is obtained, with the difference that transistors 300P are submitted to transverse tensile strain 454W and that buried layer 450 remains present under insulating layer 64. Layer 450 is, in strip area 54N, in the form of a slab 500 under each slab 260 and, in strip area 54P, in the form of a longitudinally strained band 502 (strain 452L) under band 252.

According to an advantage, the obtained transistors 300P are particularly fast, due to their having a P channel both strongly compressively strained in the longitudinal direction and strongly tensilely strained in the transverse direction. The obtained circuits are thus particularly fast.

Fourth Embodiment

FIGS. 12A to 12D schematically illustrate a final step of a fourth embodiment of a method of simultaneously manufacturing N-channel and P-channel transistors strained differently.

An SOI structure of the type of that provided at the beginning of the step of FIGS. 2A to 2D, that is, on a substrate 60, the assembly of a silicon layer 62 on an insulating layer 64, has been provided. The following steps are then implemented:
the steps of FIGS. 4A to 4D of forming a strained silicon nitride layer;
the trench forming steps of FIGS. 5A to 5D; and
the steps of FIGS. 6A to 6D, of thermal relaxation treatment, of trench filling, of removal of the strained layer, of forming of the transistors,
where layer 62', which has been shown to be in two different portions 62N and 62P in bands 54N and 54P, is replaced with layer 62 which is everywhere made of silicon.

A structure similar to that of FIGS. 6A to 6D is obtained, with the difference that, in strip area 54P, band 252 is replaced with a band 600. Band 600 is not submitted to longitudinal strain, and is submitted to transverse strain 262W similar to that of slabs 260. Transistors with an N channel tensilely strained in the longitudinal direction and transistors with a P channel tensilely strained in the transverse direction are thus obtained, which provides particularly fast circuits.

As a variation of this embodiment, the connections to potential VDD of gate structures 80' may be replaced with any structure enabling to insulate the circuits from one another, particularly with oxide bars obtained as described in relation with FIGS. 7A to 7D.

Fifth Embodiment

FIGS. 13A to 13D schematically illustrate a final step of a fifth embodiment of a method of simultaneously manufacturing strained N-channel and strained P-channel transistors.

The fifth embodiment is similar to the first embodiment, with the difference that a step of forming doped wells 650N and 650P is provided, for example, before forming trenches 250W and 250L, and that a variation of the trench etching step of FIGS. 5A to 5D is implemented.

Wells 650N and 650P are located in semiconductor substrate 60 under insulating layer 64, respectively in strip areas 54N and 54P. Wells 650N and 650P provide various effects on the transistors in operation, for example, enable to adjust their threshold voltages in order to vary their rapidity or their off-state leakage current. The doping types and levels of wells 650N and 650P depend on the effects which are desired to be obtained.

At the trench etching step, longitudinal trenches 250L extend deeper than the wells and penetrate into the substrate under wells 650N and 650P. Trenches 250W stop at a depth located in well 650N, lower than that of trenches 250L.

The structure obtained in this fifth embodiment is similar to that of FIGS. 6A to 6D, with the difference that it comprises wells 650N and 650P and that the transverse and longitudinal trenches have the above-described depths.

This ensures, on the one hand, the electric continuity of wells 650N and 650P and, on the other hand, an electric insulation between wells 650N and 650P. These wells may then be biased by bias contacts, not shown, and different actions may be taken on transistors 300N and on transistors 300P.

Generalizations

Specific embodiments have been described. Various alterations, modifications and improvements will occur to those skilled in the art. In particular, although the strained channel transistors obtained by the described embodiments are located in two side-by-side strip areas 54N and 54P, it is possible to similarly obtain transistors having an N channel tensilely strained in the longitudinal direction and with a P channel tensilely strained in the transverse and/or longitudinal direction, respectively located in alternated parallel strip areas 54N and strip areas 54P.

Further, although pairs of opposite transistors connected by a common gate structure extending both on strip area 54N and on strip area 54P are obtained, the gate structure between strip areas 54N and 54P may be interrupted, to obtain pairs of an N-channel transistor and of a P-channel transistor insulated from each other. The gate structures may also be given any configuration enabling to form connected gates of neighboring transistors.

Further, gate structures 80' provided in the second embodiment may be located at the border of a slab, astride slab 260 and trench 250W.

It should be noted that those skilled in the art may combine various elements of the various above-described embodiments without showing any inventive step. Thus, the five above-described embodiments may be combined in any manner in other embodiments, examples of which are given hereafter.

In a sixth embodiment, it is started from the structure obtained at trench-forming steps 10A to 10D of the third embodiment. It has been seen that this structure comprises a buried SiGe layer. Thermal oxide bars 350W are then formed as described in relation with FIGS. 7A to 7D, after which the transistors and the circuits are formed. A structure similar to that of FIGS. 11A to 11D of the third embodiment is obtained, with the difference that band 252 comprises oxide bars 350W under gates 80', gates 80' then not necessarily being connected to a node of application of potential VDD or of a potential greater than potential VDD.

In a seventh embodiment, a SOI structure with a buried strained SiGe layer has been provided, and the steps of FIGS. 10A to 10D of forming the trenches, and then of forming the transistors and the circuits, are implemented. A structure similar to that of FIGS. 12A to 12D of the fourth embodiment is obtained, with the difference that the buried layer is present under insulating layer 64, the buried layer being longitudinally strained in strip area 54P.

In an eighth embodiment, an SOI structure with a buried strained SiGe layer has been provided, after which the trench-forming steps of FIGS. 10A to 10D are implemented, which results, in particular, in strip area 54P, in a silicon band 600 instead of SiGe band 252. Thermal oxide bars are then formed as described in relation with FIGS. 7A to 7D, after which the transistors and the circuits are formed. A structure similar to that of FIGS. 12A to 12D is obtained, with the difference that, on the one hand, the buried layer is present under insulating layer 64 and, on the other hand, band 600 comprises silicon oxide bars under gates 80'. Gates 80' are not necessarily connected to a node of application of potential VDD or of a potential greater than potential VDD. As a variation, gates 80' may be omitted.

Further, as described hereabove, the fifth embodiment corresponds to the first embodiment where a well forming step has been provided, and where the longitudinal and transverse trenches have different depths. In all the other embodiments, one may similarly provide a well-forming step, and then provide for the longitudinal trenches to cross the wells, and for the transverse trenches to stop in the wells.

Further, embodiments comprising either a buried SiGe strained layer 450 under the assembly of semiconductor layer 62 or 62' on insulating layer 64, or a strained silicon nitride layer 200 deposited over the assembly of semiconductor layer 62 or 62' on the insulating layer have been described. Other embodiments comprise both a compressively strained layer buried under the insulating layer and a compressively strained layer deposited on the semiconductor layer. The trenches then cross the two strained layers.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An electronic integrated circuit chip, comprising:
   an insulating layer on a substrate;
   first and second side-by-side strip areas that are delimited by:
      longitudinal trenches between and on either side of said first and second side-by-side strip areas, the longitudinal trenches extending through the insulating layer and into the substrate; and
      transverse trenches extending from one edge to another edge of the first strip area and through the insulating layer and into the substrate,
   tensilely strained semiconductor slabs covering the insulating layer of the first strip area is covered, said tensilely strained semiconductor slabs located between the transverse and longitudinal trenches;
   a first portion of a semiconductor band that is compressively strained in the longitudinal direction and tensilely strained in the transverse direction, said first portion covering the insulating layer of the second strip area opposite the tensilely strained semiconductor slabs and between the longitudinal trenches;
   N-channel MOS transistors located inside and on top of the tensilely strained semiconductor slabs; and
   P-channel MOS transistors located inside and on top of said first portion of the semiconductor band.

2. The integrated circuit chip of claim 1, further comprising transverse oxide bars extending between first portions of the semiconductor band.

3. The integrated circuit chip of claim 1, further comprising insulated gates arranged on the semiconductor band, and wherein the N-channel and P-channel MOS transistors are connected to a source of high and low power supply potentials, said insulated gates being connected to a node of application of the high power supply potential.

4. The integrated circuit chip of claim 1, further comprising a buried layer made of silicon-germanium located under the insulating layer, the buried layer being compressively strained in the longitudinal direction in the second strip area.

5. The integrated circuit chip of claim 1, wherein the semiconductor slabs and the first portion of the semiconductor band are made of silicon.

6. The integrated circuit chip of claim 1, wherein the semiconductor slabs are made of silicon and the first portions of the semiconductor band are made of silicon-germanium.

7. The integrated circuit chip of claim 1, wherein the transverse and longitudinal trenches have a same depth.

8. The integrated circuit chip of claim 1, further comprising:
   a doped semiconductor well located in the first strip area under the insulating layer;
   wherein the longitudinal trenches extend deeper than the doped semiconductor well; and
   wherein the transverse trenches extend to a level located in the doped semiconductor well.

9. An integrated circuit chip, comprising:
   an assembly of a semiconductor layer arranged on an insulating layer and including first and second side-by-side strip areas;
   longitudinal trenches which extend through the semiconductor layer and the insulating layer and are located between the first and second strip areas and on either side of the first and second strip areas;
   transverse trenches which extend through the semiconductor layer and the insulating layer in the first strip area and extend from one edge to another edge of the first strip area;
   wherein said longitudinal and transverse trenches form from said semiconductor layer:
      a tensilely strained semiconductor slab in the first strip area between the transverse trenches; and
      a semiconductor band in the second strip area that is compressively strained in the direction of the longitudinal trenches and tensilely strained in the direction of the transverse trenches; and
   transistors formed inside and on top of the semiconductor slab and inside and on top of first portions of the semiconductor band located opposite the semiconductor slab.

10. The integrated circuit chip of claim 9, further comprising second portions of the semiconductor band located opposite the transverse trenches.

11. The integrated circuit chip of claim 10, wherein said second portions of the semiconductor band are made of a thermal oxide material which extends across a thickness of the semiconductor band.

12. The integrated circuit chip of claim 10, wherein said transistors comprises:

insulated gates on the second portions of the semiconductor band located opposite the transverse trenches;

a connection of the transistors to a source of high and low power supply potentials; and a connection of said insulated gates to a node of application of the high power supply potential.

13. The integrated circuit chip of claim 9, wherein the insulating layer is made of silicon oxide.

14. The integrated circuit chip of claim 9, wherein said semiconductor layer is made of silicon.

15. The integrated circuit chip of claim 9, wherein:
said semiconductor layer in the first strip area comprises a silicon layer on the insulating layer;
wherein said semiconductor layer in the second strip area comprises a silicon-germanium layer on a silicon layer on the insulating layer.

16. The integrated circuit chip of claim 9, wherein the transverse and longitudinal trenches have a same depth.

17. The integrated circuit chip of claim 9, further comprising a doped semiconductor well under the insulating layer in the first strip area, wherein said longitudinal trenches extend to a depth that is deeper than the doped semiconductor well, and wherein the transverse trenches extend to a depth to a level located in the doped semiconductor well.

* * * * *